(12) United States Patent
Seidel et al.

(10) Patent No.: US 10,923,359 B2
(45) Date of Patent: Feb. 16, 2021

(54) LIMITED DOSE AND ANGLE DIRECTED BEAM ASSISTED ALE AND ALD PROCESSES FOR LOCALIZED COATINGS ON NON-PLANAR SURFACES

(71) Applicants: Thomas E Seidel, Palm Coast, FL (US); Michael I Current, San Jose, CA (US)

(72) Inventors: Thomas E Seidel, Palm Coast, FL (US); Michael I Current, San Jose, CA (US)

(*) Notice: Subject to any disclaimer, the term of this patent is extended or adjusted under 35 U.S.C. 154(b) by 0 days.

(21) Appl. No.: 16/947,034

(22) Filed: Jul. 15, 2020

(65) Prior Publication Data

US 2021/0020452 A1 Jan. 21, 2021

Related U.S. Application Data

(60) Provisional application No. 62/875,118, filed on Jul. 17, 2019, provisional application No. 62/927,222, filed on Oct. 29, 2019.

(51) Int. Cl.
*H01L 21/311* (2006.01)
*H01L 21/3213* (2006.01)
*H01L 21/3065* (2006.01)

(52) U.S. Cl.
CPC .... *H01L 21/31116* (2013.01); *H01L 21/3065* (2013.01); *H01L 21/32135* (2013.01); *H01L 21/31144* (2013.01)

(58) Field of Classification Search
CPC ........ H01L 21/31116; H01L 21/32135; H01L 21/3065; H01L 21/31144; H01L 21/31138

USPC ....... 438/700, 706, 708, 709, 710, 712, 714, 438/719, 723, 758
See application file for complete search history.

(56) References Cited

U.S. PATENT DOCUMENTS

| | | | |
|---|---|---|---|
| 6,413,802 | B1 | 7/2002 | Hu et al. |
| 7,297,628 | B2 * | 11/2007 | Chao ................ H01L 21/76816 438/635 |
| 7,344,953 | B2 | 3/2008 | Hecht et al. |
| 7,981,473 | B2 | 7/2011 | Kim et al. |
| 8,778,715 | B2 | 7/2014 | Bellinger et al. |
| 10,381,227 | B2 | 8/2019 | George et al. |
| 2006/0064232 | A1 | 3/2006 | Ampunan et al. |
| 2014/0017817 | A1 * | 1/2014 | Godet ............... H01J 37/32422 438/3 |
| 2016/0293445 | A1 * | 10/2016 | Han ................ H01L 21/76816 |
| 2020/0161140 | A1 | 5/2020 | Seidel et al. |

OTHER PUBLICATIONS

Abdulagatov, A.I.; et al., "Thermal Atomic Layer Etching of Silicon and Silicon Nitride Using an Oxidation and "Conversion-Etch" Mechanism", AVS International Symposium & Exhibition, Long Beach, Oct. 21-26, 2018, 36 pgs.

(Continued)

*Primary Examiner* — Lan Vinh
(74) *Attorney, Agent, or Firm* — Ascenda Law Group, PC

(57) ABSTRACT

Processes for the localized etching of films on the sidewalls of non-planar 3D features such as a trench or a FinFET array. The etch process has a first step of an angle-directed ion implant beam, with the beam being self-aligned onto a localized region on a sidewall feature, that functionalizes the region for a second step that etches the ion implanted region.

13 Claims, 6 Drawing Sheets

(56) References Cited

OTHER PUBLICATIONS

Cremers, V.; et al., "Conformality in atomic layer deposition: Current status overview of analysis and modelling", Appl. Phys. Rev. (2019), 6:021302-1-021302-43.

Current, M.I., "Perspectives on Low-Energy Ion (and Neutral) Implantation", Proc. 17th International Workshop on Junction Technology, IEEE, Jun. 2017, Uji, Japan, 7-12 (2017), 6 pgs.

Dumont, J.W.; et al., "Thermal Atomic Layer Etching of $SiO_2$ by a "Conversion-Etch" Mechanism Using Sequential Reactions of Trimethylaluminum and Hydrogen Fluoride", ACS Appl. Mater. Interfaces (2017), 9:10296-10307.

Elam; et al., "Conformal Coating on Ultrahigh-Aspect-Ratio Nanopores of Anodic Alumina by Atomic Layer Deposition", Chem. Mater. (2003), 15(18):3507-3517.

Faraz, T.; et al., "Energetic ions during plasma-enhanced atomic layer deposition and their role in tailoring material properties", Plasma Sources Sci. Technol.(Feb. 28, 2019), 28(024002), 20 pgs.

Gutsche, M.; et al., "Capacitance Enhancement Techniques for Sub-100nm Trench DRAMs", IEDM Tech. Dig. (2001), 4 pgs.

Johnson, N.R.; et al., "$WO_3$ and W Thermal Atomic Layer Etching Using "Conversion-Fluorination" and "Oxidation-Conversion-Fluorination" Mechanisms", ACS Appl. Mater. Interfaces (2017), 9:34435-34447.

Kanarik, K. J. et al., "Atomic Layer Etching: Rethinking the Art of Etch", J. Phys. Chem. Lett. (2018), 9:4814-4821.

Knoops, C. M. et al., "Conformality of Plasma-Assisted ALD: Physical Processes and Modeling", Journal of The Electrochemical Society (2010), 157(12):G241-G249.

Lee Y.; et al., "Trimethylaluminum as the Metal Precursor for the Atomic Layer Etching of $Al_2O_3$ Using Sequential, Self-Limiting Thermal Reactions", Chem. Mater. (2016), 28:2994-3003.

Lee, D-H.; et al., "Removal of Aspect-Ratio-Dependent Etching by Low-Angle Forward Reflected Neutral-Beam Etching", J. Korean Physical Society (2005), 46(4):867-871.

Lee, Y; et al., "Thermal Atomic Layer Etching of Titanium Nitride Using Sequential, Self-Limiting Reactions: Oxidation to $TiO_2$ and Fluorination to Volatile $TiF_4$", Chem. Mater. (2017), 29:8202-8210.

Lee, Y. et al., "Selectivity in Thermal Atomic Layer Etching Using Sequential, Self-Limiting Fluorination and Ligand-Exchange Reactions", Chem. Mater. (2016), 28:7657-7665.

Mane, A.; et.al., "AA2-WeA-6 Fluorine Free Boron-Containing Composite Layers for Shallow Dopant Source Applications", Abstract for Paper AA2-WeA6, ALD 2019—Seattle, (Jul. 24, 2019), 3 pgs.

Mane, A.U.; et al., "Atomic layer deposition of boron-containing films using $B_2F_4$", J. Vac. Technol. (2016), A34(1):01A132-1-01A132-5.

Oehrlein, G.S. et al., "Atomic Layer Etching at the Tipping Point: An Overview", ECS J. of Solid State Sci. and Tech. (2015), 4(6):N5041-N5053.

Park, SD; et al., "Atomic Layer Etching of Si(100) and Si(111) Using $Cl_2$ and Ar Neutral Beam", Electrochemical and Solid State Letters (2005), 8(8):C106-C109.

Sprenger; et al., "Electron-Enhanced Atomic Layer Deposition of Boron Nitride Thin Films at Room Temperature and 100° C.", J. Phys. Chem. C (2018), 122:9455-9464.

Sprenger, J.K., "Electron Enhanced Atomic Layer Deposition (EE-ALD) for Room Temperature Growth of Gallium Nitride, Silicon, and Boron Nitride Films", Thesis, University of Colorado, Department of Chemisty (2017), 153 pgs.

Kim; et al., "A Process for Topographically Selective Deposition on 3D Nanostructures by Ion Implantation", ACS Nano (2016), 10, 4451, 15 pgs.

Zheng, P., "Advanced MOSFET Structures and Processes for Sub-7 nm CMOS Technologies," Thesis, UCB (2016), Technical Report No. UCB/EECS-2016-189, 74 pgs.

\* cited by examiner

LIMITED DOSE AND ANGLE DIRECTED BEAM ASSISTED ALE AND ALD PROCESSES FOR LOCALIZED COATINGS ON NON-PLANAR SURFACES

RELATED APPLICATIONS

This is a NONPROVISIONAL of, claims priority to, and incorporates by reference U.S. Provisional Application No. 62/875,118, filed Jul. 17, 2019, and U.S. Provisional Application No. 62/927,222, filed Oct. 29, 2019.

FIELD OF THE INVENTION

The present invention relates to process for localized deposition and etching of films on sidewalls of non-planar three dimensional ("3D") features such as a trench or a FinFET array.

BACKGROUND

Processes exist for the local deposition of films only on the tops and bottoms (J. K. Sprenger et al., J. Phys. Chem. C 2-18) or separately only along the sidewalls (W-H Kim, et al., ACS Nano 2016, 10, 4451) of a 3D feature such as a trench, via, or fin walls in a FinFET array. Also, it is well established that thermal Atomic Layer Deposition (ALD) provides conformal coatings of uniform thickness over 3D surface structures, using self-limiting processes and saturating doses. Examples are conformal coatings on DRAM trenches (Gutsche, M., et al., IEDM Tech. Dig., pg. 411, (2001)) and channel surfaces of finFETs (Hu, C-M., et al., U.S. Pat. No. 6,413,802 (2 Jul. 2007)). A review of conformality of ALD films on features of interest having different geometries was discussed using an Equivalent Aspect Ratio (EAR) concept by Cremers (Cremers, V., et al., Appl. Phys. Rev. 6, 021302 (2019)). The EAR of a given 3D feature was defined as the aspect ratio of a hypothetical cylindrical hole that would require the same reactant exposure dose to conformally coat the feature during an ALD reaction as the feature of interest.

If an atomic layer deposition (ALD) dose is limited and less than that which allows reacting chemical precursors to reach remote locations of non-planar features such as the bottom of trench features, then only the top of the trench is coated. Hecht et al., U.S. Pat. No. 7,344,953, and Kim et. al., U.S. Pat. No. 7,981,473, describe ALD's capability to deposit localized coatings using limited doses. In particular, Kim describes limited doses for obtaining higher film deposition rates by reducing purge times, while Hecht describes limited ALD doses for deposition on the top of a DRAM trench and uses the local deposited film as a mask to etch a bottle structure. Both Kim and Hecht illustrate localized coatings near the top of a high aspect ratio trench structures using limited dose ALD, as shown in the schematic in FIG. 1. Limited dose trimethylaluminum (TMA) may be used to functionalize the top surface, followed by water or ozone to place an $Al_2O_3$ film just at the top of a high aspect ratio film. The insert anticipates difficulty for coating the top of a low aspect ratio feature due to gas permeation into the slots between fins. However, no processes are generally reported for placing localized films at different positions along the sidewalls of 3D features.

It may possible to use limited dose atomic layer etch (ALEt) to etch off the tops of films on high aspect ratio features and leave a film at the bottom of the feature (Seidel et al., U.S. patent application Ser. No. 16/665,940, filed Oct. 28, 2019). Limited dose ALEt may result in selectively etching the tops of films in 3D features having small openings and large depths.

Because of the similarity between ALD and ALEt, an estimate of the profiles of limited dose ALEt may be made by examining the profiles of ALD in the limited dose regime. Measurements and Monte Carlo simulations of chemical ALD reactions of diethylzinc (DEZ) for ZnO ALD into anodic alumina holes of tens of nanometer (nm) diameter and aspect ratios ~1000 have been published, (Elam et al., Chem. Mater., Vol 15, No. 18, 2003). Exposure times of 1 to 30 s showed the profile straggle values ~4 to 15 microns along the depth of the hole. Extrapolation of these data to exposure times of $10^{-2}$ sec, implies profile transition widths of approximately hundreds of nm.

Thus, features having vertical heights of the nm scale may not have localized films with distinct boundaries between etched and non-etched vertical surface films on the sidewall. Limited doses of gaseous precursors in a thermal atomic layer etch process (T-ALEt) can have a broad distribution or not a distinct boundary or small taper between the etched and unetched film's vertical profile, so application to nm scaled devices is problematic.

ALEt processes are generically similar to ALD, but instead of growing a film, the surface is etched, layer-by-layer with a self-limiting process. Thermal atomic layer etch (T-ALEt) processes modify the surface to be etched under exposure of a first precursor so the surface is functionalized for a second etching precursor, then a monolayer, or a few monolayers, or a fraction of monolayer of the material is removed in the by-products of the second precursor etch reaction step, (Lee Y. and George S. M., Chem. Mater. 28, 2994, 2016). Detailed processes for thermal ALEt processes have been described. (Id.; DuMont, J. W., ACS Appl. Mater. Interfaces, 9, 10296-10307 (2017); Lee, Y. and George S. M., Chem. Mater. 29, 8202 (2017), Johnson, N. R., *ACS Appl. Mater. Interfaces* 9, 34435 (2017); and Abdulagatov, A. I. and George, S. M, AVS Long Beach Oct. 21-26, 2018). The T-ALEt films described by the George group are listed along with their properties in FIG. 2. The table in FIG. 2 shows the films etched (100) as well as the "Modification" precursors (101). Compatible etching chemistries (102) and process temperature windows (103) are also shown. The etching rates (104) average of about 0.5 Å/cycle. Materials that do not etch for a given chemistry are in the last column (105). If non-etched materials are used as substrates, the etching is selective and stops on the substrate Thermal ALE processes have thus been described for $Al_2O_3$, $ZrO_2$ and $HfO_2$, however, the HF-TMA or HF-Sn(acac)$_2$ chemistries used do not etch $SiO_2$, SiN or TiN. So, if these latter materials were substrates, they would selectively not etch, while $Al_2O_3$, $ZrO_2$ and $HfO_2$ do etch. For $SiO_2$, exposure to TMA converts the surface to $Al_2O_3$, and when followed by the HF-TMA process etches the converted $Al_2O_3$ (DuMont, et al., supra). For TiN a modification process uses $O_3$ to convert the surface to $TiO_2$ followed HF (Lee and George, *Chem. Mater.* 29, supra). For Si or SiN, $O_3$ converts the surface to $SiO_2$, followed by TMA to convert the surface to $Al_2O_3$, followed by HF-TMA (Abdulagatov, A. I. and George, supra). For W, Abdulagatov and George used $O_3$ to convert the surface to $WO_3$, followed by $BCl_3$ exposure to convert the surface to $B_2O_3$, which then is etched using HF (Johnson, N. R. and George, S. M., *ACS Appl. Mater. Interfaces* 9, 34435 (2017)).

ALE may be done by thermal processes where both half-reactions are thermal (T-ALE), or a process where one or both half-reactions are plasma assisted (PA-ALE). The all-thermal process is isotropic, and the plasma assisted processes are typically anisotropic because of the directionality of the beam species. Plasma assisted ALEt (PA-ALEt) processes have also been studied (Kanarik, K. J. et al., J. Phys. Chem. Lett. 9, 4814 (2018) and brought to a commercial stage. Conventional PA-ALEt processes start with a first step of ion beam chemical modification reaction to functionalize the near surface region, followed by a low energy ion bombardment (typically Ar+ from an argon plasma) to remove by sputter etching the chemically modified material. The ion modification precursors are typically vertically directed. Areas not functionalized are not sputter etched. For this disclosure, the modification precursors (101) are angle-directed ion implanted. Other ion functionalization precursors such as $Cl^+$ and $Cl_2^+$, $CFx^+$ may be used (Id.).

A review of ALE with a focus on plasma processes has been provided by Oehrlein (Oehrlein, G. S. et al., ECS J. of Solid State Sci. and Tech., 4 (6) N5041-N5053 (2015)). This review includes many etching processes for many different substrate materials: $Al_2O_3$, Ge, graphene, Si, $HfO_2$, to mention a few, using most notably $Cl_x^+$ and $CF_x^+$ followed by a low energy $Ar^+$ directed etch step. The etch step may also use an energetic neutral Ar beam (Park, S-D et al., Electrochemical and Solid State Letters, 8(8), C106 (2005)).

For plasma-assisted ALD, the ability to obtain conformal deposition in high aspect ratio structures is less straightforward than thermal ALD. (Knoops, C. M. et al., Journal of The Electrochemical Society. 157. G241-G249. 10.1149/1.3491381 (2010)). Localized film depositions are related to the broader, highly active field of selective deposition. Localized depositions have been referred to as "Topologically Selective" by Faraz. (Faraz, T. et al., *Plasma Sources Sci. Technol.*, DOI: 10.1088/1361-6595/aaf2c7, (2018)). Ion implantation has been used to modify surfaces at the top and bottom of trench features and followed by selective ALD of Pt on the vertical side-walls of a trench (Kim, W-H, et al., ACS Nano, (2016)) but not the top or bottom, and not at a controlled distance along the feature sidewall. Electron exposure has been used to selectively deposit SiN on the top and bottom of 3D trenches, but not along the sidewalls. (Sprenge, J. K. et al., AVS Mtg. Long Beach, (2018)). These depositions are certainly "topologically selective" but are not on designated sidewalls locations of high aspect ratio features.

Thermal ALEt chemistries have been described in patent applications by Lee and George (U.S. Provisional Patent Application Nos. 62/093,595 and 62/154,99) and anticipate the use of T-ALEt processes for three dimensional (3D) structures. However, their disclosure does not describe or disclose the use of angle-directed ion implantation beams for film functionalization of etching on 3D sidewall structures.

Gates in FinFET structures have side-wall coatings. (Hu, U.S. Pat. No. 6,413,802). Doped oxide films may be locally deposited using ALD (Mane, A. U. et al., J. Vac. Technol. A34(1) (2016) 01A132-1) followed by a local etching of the upper part of the fin sidewall and followed by thermal diffusion. Source-drains as well as fin-base counter doping from localized doped oxides on the walls of fins are application of the processes described herein.

To the knowledge of the inventors, no reports of angle-directed implantation to functionalize localized areas on the sidewalls of 3D structures using an atomic layer etch process have been described.

SUMMARY OF THE INVENTION

We describe Limited Dose Atomic Layer Etching (LD-ALE) as well as Angle-Directed Beam ALE (ADB-ALE) in combination with ALD and Limited Dose ALD (LD-ALD) to place films on various locations of non-planar, high and low aspect ratio features. In one embodiment, a film etch process using a self-aligned and angle-directed implant beam onto a localized region of a sidewall region of a 3D feature for film modification, with the modified region enabling a second step of localized atomic layer etching by either thermal or energetic beams, is provided.

In a further embodiment, the present invention provides a method that includes directing a beam of chemically reactive molecular or atomic species onto a coating film on a non-planar feature of a semiconductor structure (e.g., a trench, hole, fin, or finFET). The beam is incident at an angle with respect to a sidewall of the non-planar feature on which the coating film is present, that angle being between horizontal and perpendicular to the sidewall. The beam is masked, at least partially, by one or more adjacent structures on a semiconductor substrate, providing masked and non-masked areas on the non-planar feature's sidewall. A non-masked portion of the beam produces a functionalized exposed area of the coating film as defining a film modification area along the coating film along the sidewall by chemical functionalization of the coating film in an area on which the non-masked portion of the beam is incident. Thereafter the functionalized exposed area of the coating film is etched, using a compatible etch chemistry, leaving a residual coating film in a non-etched area. A compatible etch chemistry is one that etches the functionalized coating film but not the non-functionalized coating film.

In various embodiments, the beam may be made up of energetic ions, radicals, and/or neutral species. Further, the etching may be performed using a compatible angle directed beam of energetic ions, radicals, and/or neutral species, or by a compatible atomic layer etch process or processes. The angle of the beam of chemically reactive species may be between 5 and 85 degrees with respect to the sidewall of the non-planar feature on which the coating film is present. Compatible chemistries, as the term is used herein, are those which use a modification (functionalization) chemical reaction followed by an etching chemical reaction for removing the film to be etched. Examples are listed in FIG. 2. The compatible chemistry HF/Sn(acac)2 etches $Al_2O_3$, $ZrO_2$ or $HfO_2$, so if $ZrO_2$ and/or $HfO_2$ were on an $Al_2O_3$ substrate, the substrate would etch, but if $Al_2O_3$, $ZrO_2$ or $HfO_2$ were on a silicon substrate, the substrate would not etch. A compatible chemistry may or may not etch the substrate underlying the film.

In some cases, the adjacent structure(s) on the semiconductor substrate may be one or more dummy structures, e.g., around a perimeter of the non-planar feature(s).

Also, the beam of chemically reactive species may have ion specie energies or equivalent energies in a range of 15-1000 eV and taper values of the coating film at a transition region between the film modification area and an unmodified portion of the film along the sidewall may be in a range of 1-10 nm.

The coating film may be one of: $Al_2O_3$, $HfO_2$, $ZrO_2$, SiN, Si, and W, the beam of chemically reactive molecular or atomic species may be one of: $HF^+$, $F^+$, $H^+$, $Al(CH_3)_3^+$, $O^+$, $O_2^+$, $O_3^+$, $BCl_3^+$, or combinations thereof, and etching the functionalized area of the coating film may include using one of: $Al(CH_3)_3$, $Sn(acac)_2$, $SiCl_4$, or HF, whether ionized or not.

The use of angle-directed beams using a plasma assisted ALEt (PA-ALEt) processes is proposed to achieve a small taper between etched and unetched films for localized etching and thereby leaving localized deposition on the sidewalls of 3D features.

In the current disclosure, a localized doped oxide on the foot of the fin of a FinFET is proposed for fin-base counter doping using the self-aligned angle-directed ion beam etching processes.

DESCRIPTION

Figures 1, 2:
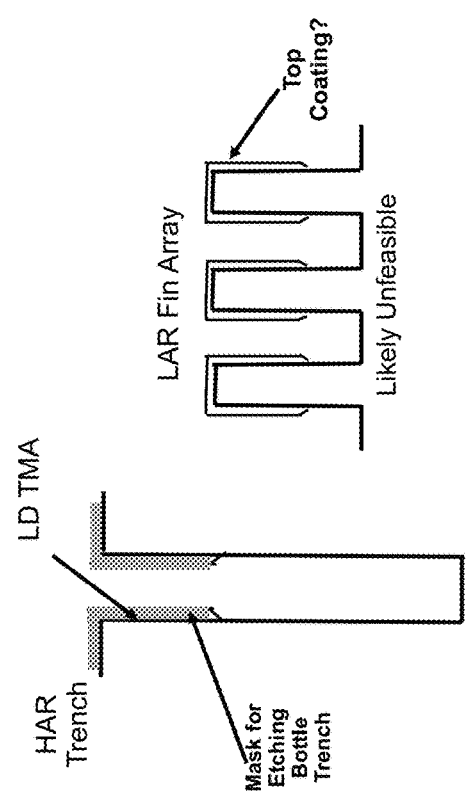
FIG. 1 illustrates an example of LD-ALD for localized top coating on high aspect ratio (HAR) adapted from Hecht et al., U.S. Pat. No. 7,344,953, in which the insert indicates the use of limited dose ALD for top coating of a low aspect ratio (LAR) structure as unfeasible due to gas permeation into the slots.
FIG. 2 is a table containing metrics for T-ALEt. The columns left to right are: the material being etched, the modification (or functionalization) precursor, the etch precursor, a temperature window for etching, etch rates, and lastly, the materials known not to etch for the material film and chemistry listed.

For the pursuit of placing localized films on the vertical sidewalls of 3D features, it is desirable to have an abrupt vertical transition region between etched and unetched sidewall films. In order etch a localized film on vertical surfaces of 3D structures gas precursors may be exposed for a short time to limit reactions to a short distance near the top of the feature. However, even with pressures of a few torr and milliseconds exposure times, penetration depths into the feature of the limited dose reacting gas may be of the order of several hundreds of nm. While large penetrations and poorly defined boundaries between etched and unetched regions tapers may be useful for ~5-10 micron sized devices or to adjust the thickness of sidewall features, features with nm vertical heights may not be made with distinct boundaries between etched and non-etched regions on the sidewall using a limited dose ALD and ALE combination process. A different approach than timed gas injection into the feature is needed.

ALD may be used to place a conformal film entirely over the sidewall of a high aspect ratio (HAR) or low aspect ratio (LAR) 3D structure. Following the conformal coating, a self-aligned, angled implantation of a chemical reactive species, or a self-aligned, angled damaging implantation can functionalize the upper region of the structure for etching. This leaves a film localized at the bottom of the feature which is the lower part of the earlier deposited conformal film.

Described herein is a self-aligned, angle-directed ion implantation beam processes that modifies or functionalizes the area to be etched with an abrupt vertical boundary on a sidewall of a 3D feature (or, more generally, a non-planar feature of a semiconductor structure, e.g., a trench, hole, fin, etc.). This is followed by either a thermal atomic layer etch (T-ALEt) step to remove/etch the modification region or an angle directed ion beam etch step. The angle-directed modification step is at angle(s) that are not horizontal to the vertical sidewall of a 3D feature and are typically at angle(s) that are not vertical with respect to the plane of the processed substrate. Angle-directed ions having larger angles result in corresponding smaller values of the height of the unetched sidewall film. This the case whether the feature is an array of high aspect ratio (HAR) hole-trenches or a lower aspect ratio (LAR) fin array.

Standard T-ALEt processes are isotropic, while standard PA-ALEt processes are anisotropic because of the directionality of the ion etch process and has been called "Directional ALE." The direction is typically vertical. In contrast, in a preferred embodiment of the invention ALEt uses an angle-directed-off the vertical-ion implanted beam that chemically functionalizes a local region on the wall of a 3D feature in the first step of a two-step process. This is followed by a second step using thermal chemical exposure for ligand exchange and by-product removal to affect a localized etch on the sidewall of a 3D feature. This is an ion/thermal not a thermal/thermal or an ion/ion process sequence.

Figure 3:
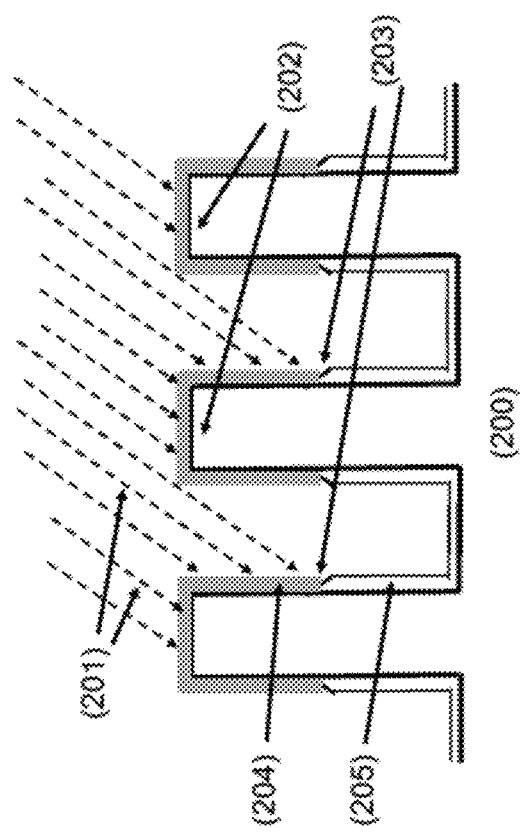
FIG. 3 is a schematic of a fin array features, illustrating a self-aligned angle-directed single beam for modification of one side of the upper region of a fin array.

Referring to the FinFET array shown in FIG. 3, a self-aligned and angle-directed ion implantation beam (201) is shadowed by the tops of the "on-chip" features as a self-aligned mask (202). The masked beam defines the vertical position of the film modification edge (203) along a vertical sidewall. Primary ions that impinge the on-chip feature mask (204) cannot reach the bottom of the feature. Ions stopped by the top of the feature do not reach the lower coated area (205). Accordingly, the etch step removes only the functionalized region near the top of the feature (204), leaving a film on the lower part (205) of the fin array features. eIon modification is to be provided for both upper sides of the fins. This is described with reference to FIG. 4, below.

Referring to the FinFET array shown in FIG. 3, for the case of vertical fin features having for example 3-30 nm total height dimensions an angled-directed ion implantation of chemical or damage provides the "modification" reaction or surface functionalization for localized atomic layer etch in the upper part of the fins. This may be useful for feature sizes and pitch of the order of a nm or a few nm and feature aspect ratios may be in the range 3 to 100. Larger or smaller features are also applicable.

It is possible to use the thermal ALEt chemistries described in FIG. 2 by implantation of modification precursors. Examples of ions that chemically may functionalize the surface for $Al_2O_3$, $HfO_2$, $ZrO_2$, SiN, Si, TiN, W, and SiN films include but are not limited to chemically active ion species corresponding to thermal species used for modification such as $HF^+$, $F^+$, $H^+$, $Al(CH_3)_3^+$, $O^+$, $O_2^+$, $O_3^+$, $BCl_3^+$ or combinations of these ion species. The use of these species enables the use of a thermal etch chemistry step used as the second step of the two-step etch process. Etch chemistries are listed in the third column (102) in FIG. 2. These ion modification species correspond to those used by the George group for an all thermal ALE process, as shown in column 2 (101) in FIG. 2. Because chemical species these ions may be self-aligned and angle directed implanted into surfaces, it is possible to etch those surfaces with the corresponding thermal etch step. So, for example, if a conformal film of $Al_2O_3$ is deposited in a silicon fin array, it may be angle-directed implanted by HF+ and then etched with thermal TMA. The underlying silicon will not etch.

The use of ion beams may increase the productivity of the process, when compared with an all thermal chemical precursor modification and subsequent etch step processes. The range of low energy ions may increase the functionalized depth to a nm or more level, which can improve the removal rate per cycle. Use of higher energies and ranges providing larger functionalized depth may not be strictly atomic layer-by-layer etching but may be useful. Increased ion functionalization depth and range increases the etch rate but is a trade off against the limiting the abruptness of the transition region between etched and unetched regions on the sidewall film. In a preferred embodiment the modification step may use ions of the precursors defined in FIG. 2, column 2 (101) but then followed by a thermal etch step using chemistries of column 2 (102), since the implanted ions would functionalize the film to be etched.

The thermal etching step should remove the entire depth of the ion modified film. There are advantages to etching thermal, rather than etching by a second angle-directed ion etch process. Using a second angled beam that has the same angle as the modification beam may be more difficult than thermally etching the functionalized region. Thermal etch process would have the same selectivity on the sidewall substrate as obtained in planar case shown in FIG. 2. There are fewer parameters to control for a thermal ALE removal step than an ion beam removal step.

Figure 4:
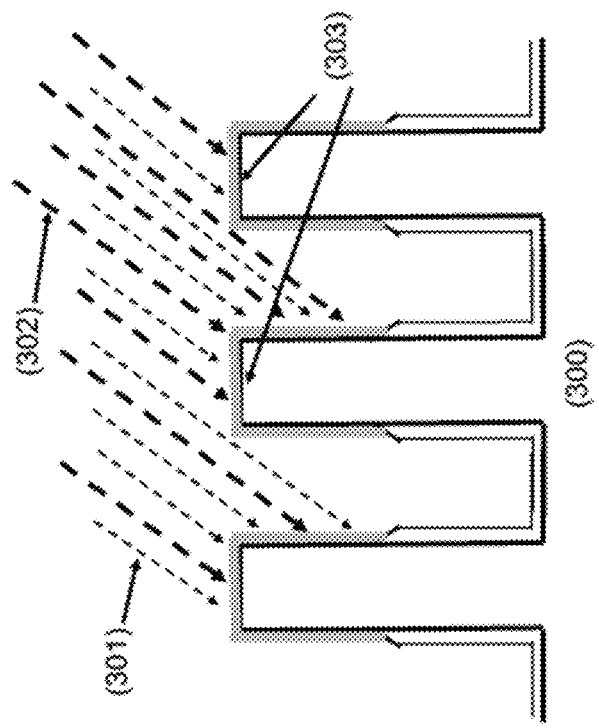
FIG. 4 is a schematic of a fin array features, illustrating a self-aligned angle-directed double beam for modification and etch of one side of the upper region of a fin array.

However, referring to the FinFET array in FIG. 4, for the case of vertical fin array features an angled-directed ion implantation (301; light dashed arrows) for the chemical "modification" reaction or surface functionalization may be followed by an etching step using $Ne^+$ or $Ar^+$ ions (302; bold dashed arrows). An example case would be for a conformal $SiO_2$ film on a silicon fin. The modification beam may be $CHF_3^+$ (301) with energy values selected to set the depth of the modification of the angled chemical implant. This is followed by an etching step using $Ne^+$ or $Ar^+$ ions (302) with an energy range 30-80 eV but would reach the chemically modified specie, and preferably not reach the underlying silicon substrate. If the etching energy did reach the underlying unmodified Si substrate, it would not etch the Si unless the energy was larger than that which broke Si bonds (Kanarik, K., J. Phys. Chem. Lett. 2018, 9, 4814-4821).

In another embodiment, e.g., to etch Si, Ta, $SiO_2$, $Al_2O_3$, $TiO_2$, ZnO, SiN films, a process similar to the standard plasma assisted atomic layer etch PA-ALEt process is proposed. In the standard "directed beam" plasma assisted ALE approach the direction is typically vertical. In this application, a modification process is to be done first with a self-aligned angle-directed beam for modification using chemistries such as $Cl^+$, $Cl_2$, $SiClx^+$ or $CHFx^+$ species and followed by an etch process step, using angle-directed $Ar^+$ or $Ne^+$ that has the same or similar incoming trajectory as the modification species. See, e.g., FIG. 4.

In all application methods where ion beams are used, the transition region between etched and unetched regions on the sidewalls are defined by the ion straggle at end-of range ion stopping process. For ion energies in the 15-1000 eV range, typical straggle or film taper values may be of order 1-10 nm.

Figure 5:
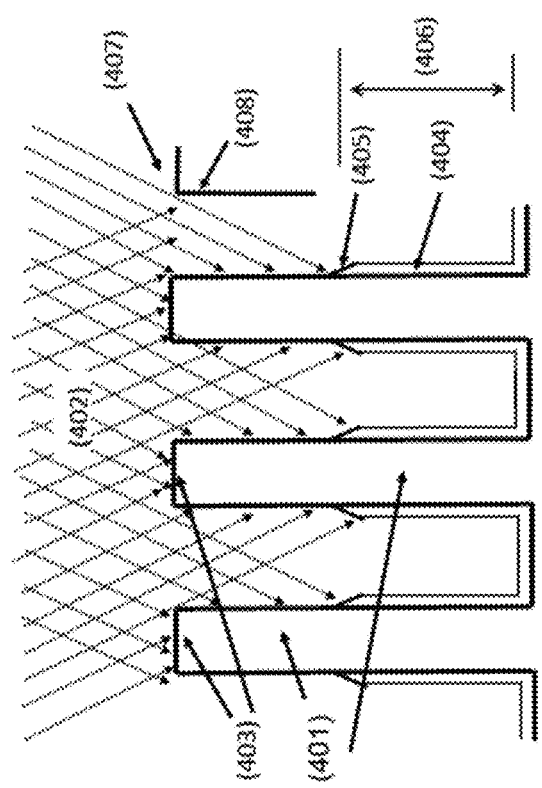
FIG. 5 is a schematic of a fin array features, showing a localized etched and removed film from the tops of both sides of the fin. Two opposite angled-directed ion implantation paths, each self-aligned by the tops of the fins are shown. A dummy feature at the right provides functionalization of both sides of the end fin.

Referring to the FinFET array in FIG. 5, vertical fin features (401) are shown for an implementation case for angled-directed ion implantations (402) for both side surfaces. Chemical or damage "modification" species for localized atomic layer etching the upper part of the fins may be used. A directed, angled implant species is shadowed by the feature tops (403) to provide self-alignment. Ions stopped by the top of the feature do not reach the lower coated area (404). Accordingly, a following etch step removes only the functionalized region near the top of the feature, leaving a sidewall film on the lower part (404) of the fins. The boundary separating the etch modification areas and non-modification areas is small (405) and the height of the unetched sidewall film (406) is indicated. The angle of the ion modification species is indicated (407). A mask rail (a "dummy fin") (408) that wraps around the fin array may be used to functionalize the outside of the end fins to the right, as well as the ends facing out of the page. Implant modification onto both sides of the fins is required for any of the sequences described in the application.

Low energy ion implant capabilities are often referred to as "Plasma Immersion Ion Implant" (PIII) or "Plasma Assisted Deposition" (PLAD). Beam energies include but are not limited to a range such as 15 eV to 1 kV. A small taper of the order 1-10 nm may be achieved as ion straggle dimensions are in this range for typical ion species. This may provide a small distinct boundary between etched and unetched film regions. The beam angle is defined as the angle the beam makes with the vertical. The beam angle may be varied between approximately 5 and 85 degrees to move the position of the boundary between etched and unetched sidewall film. A beam angle near 5 degrees etches near the top only, while a beam at 85 degrees etches near the bottom of the vertical feature. Angles lower than 5 or higher than 85 degrees may create unwanted sputtering effects. Sputter effects are in general undesirable. Energies, incident angles and angular distributions may be selected to achieve desired result(s). Radicals or neutral energetic angle-directed beams may be used throughout in lieu of angle-directed ion beams.

Apparatus for angle-directed beams may not be commercially well developed. However, high pressure plasma ion sources used for vertical implant or etch that have a variety of different angles may be configured with columnated, offset slits and used for angle-directed implant and etch. (e.g., a gridded ion thruster type design, by H. Kauffman, or a columnated source by I. Berry US PGPUB 2016/0064232 A1.)

The self-aligned angle-directed ion beam (SA-ADIB) etch process described herein can be used instead of LD-ALE to leave films at the bottom, at the middle and separately also at the top and bottom of a high aspect ratio 3D structure as described in Seidel et al., U.S. patent application Ser. No. 16/665,940.

It is important to distinguish between processes which form a high aspect ratio structures, templates or substrates and the modification of those structures by adding or removing localized films on the surfaces of those features. Localized films described by the processes described herein achieve localized films on an already formed template having high aspect ratios. A non-etched remaining doped film located below the etched region on a silicon fin may provide a doping source for the base of a fin. Whether doped or undoped, a localized film at the base of a fin may act as a mask for doping processes along the upper region of the sidewall of the FinFET.

It should be apparent that the present invention is applicable to many different 3D morphologies and the detailed limited dose results depend on the shape of the opening and the aspect ratio. Hole features may have different opening shapes: circular, square, diamond, or an irregular perimeter, or a slot where the width is small compared to the length. As chemical precursors are exposed at a partial pressure for a limited time, giving a limited dose, surface reactions near the entrance to the hole take place with a sticking coefficient characteristic of the receiving surface ligands and the precursor used. A precursor with a high sticking coefficient would have reactions taking place "top-down" with a relatively small taper near the lower edge of the modified reaction surface. If two different etching chemistries are available, the higher sticking coefficient, or the more rapidly saturating modifying reaction would be desired. Limiting the time (dose) limits the distance the precursor travels into the hole opening, so only ALD deposition or ALE etching takes place near the top of a hole. A typical high aspect ratio (HAR) of ~1000 is useful for defining the practicality of the proposed localized processes using a limited dose approach.

Figure 6:
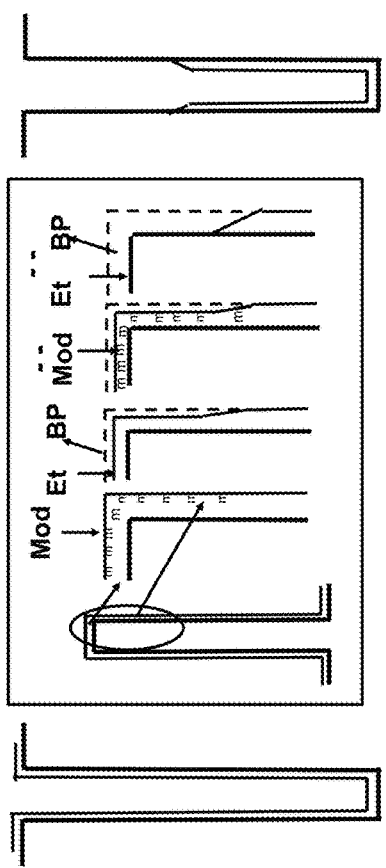
FIG. 6 is an illustration of the coating of the bottom of a high aspect ratio trench by first conformally coating the trench (left) followed by a repeated limited dose ALE process (center); Mod is the Modification precursor and m is the modified film surface, Et is the Etch precursor and BP is the By-Product of the etch, resulting in a localized film only at the bottom of the feature (right).

Placement of a film at a bottom of an HAR hole can be achieved using a conformal deposition by ALD followed by LD-ALE. First a conformal ALD process is used to coat the vertical inside and planar top of the hole feature uniformly, see FIG. 6 at left. This is followed by a limited dose ALE process to remove the top part of the conformal ALD film. The limited dose ALE step itself may be a two-step thermal ALE process, e.g. as developed by the George group, where the modification step (e.g. "Fluorination") is dose limited but the etch step may or may not be dose limited. The etch step dose must be sufficient to achieve an etch reaction over the desired removal depth. The basic limited dose ALE process showing the modification and by-product etch is illustrated in FIG. 6 at center. For a typical implementation, the Knudsen number is Kn>>1 and the mean free path is larger than the hole effective diameter. The molecular transport has a diffusive component and the edge of the etched zone will have a taper. If the sticking coefficient for the modification reaction is relatively high, the taper will be relatively abrupt and a distinct boundary will occur between the etched film and the conformal film. If two different etching chemistries are available, the one with higher sticking coefficient is desired. When the LD ALE is repeatedly applied to the conformal film previously deposited, the result is the desired remnant film at the bottom of the feature, illustrated in FIG. 6 at right. Other sequence scenarios are possible for different film placements.

Figure 7:
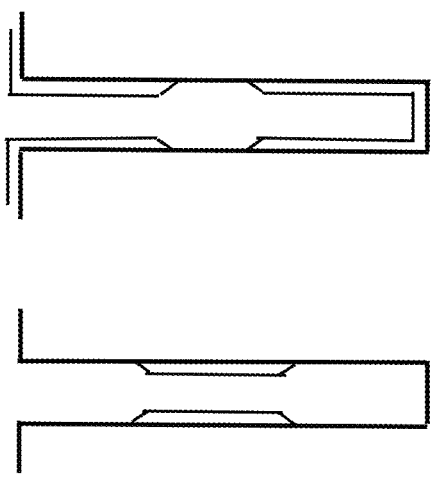
FIG. 7 is an illustration of coating on center (left) using LD-ALD followed by LD-ALE and coating top and bottom (right) using ALD followed by LD-ALE, followed last by LD-ALD, both on high aspect ratio features.

Placement of a film near the center of a HAR hole may be achieved by initially using a LD-ALD with exposure doses for the deposited film to reach below the center of the depth of the hole. This is followed by a LD-ALE step to remove the film near the top of the hole. This is a two-step process leaving a film at the central sidewall location of the hole. See FIG. 7 at left.

Placement of a film at the top and bottom of a HAR hole may be achieved by conformal deposition over the entire feature, followed by a LD-ALE to etch to a desired depth, e.g. below the center of the depth of the hole. Finally, this is followed by a LD-ALD to deposit a film near the top of the feature. This three-step process leaves films at the bottom and top of the HAR hole. See FIG. 7 at right.

Challenges to implementation of these processes include managing: the size of the taper, throughput, delivering the modification dose reproducibly, reactor and shower head design, conditioning feed lines, reactor surfaces and dealing with device layout of features.

Figure 8:
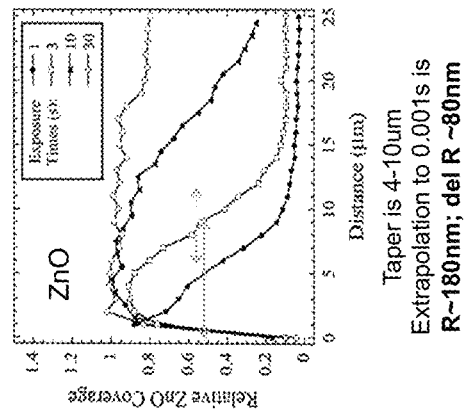
FIG. 8 shows an inference of ALE etch profile taper from ALD data by Elam, J. et al., Chem. Mater. 15, 3507-351, (2003); distribution of the profile tail is molecular diffusion limited; Profile range (R) are solid lines; straggle or taper (del R) are dashed lines.
Figure 8:
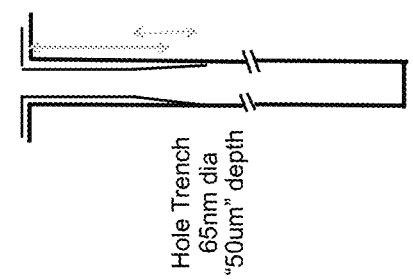

The size of the taper is a leading concern because sticking coefficients are typically small. Because of the similarity between ALD and ALE, an indication of the profile of LD-ALE layers can be obtained by looking at ALD film profile data for HAR hole features. Published profiles for ALD and an example of this data by Elam, supra, is shown in FIG. 8. For 65 nm diameter holes in anodic alumina of ~50 um depth (and AR ~1000), a 3 sec exposure for ZnO has ~100% coverage down to 5-7 um, with a taper extending out to 15 um. If exposure times are extrapolated down to millisecond times, the diffusion tail is still very large, ~80 nm. A large taper of etch profile limits the scope of thermal process applications.

Figure 9:
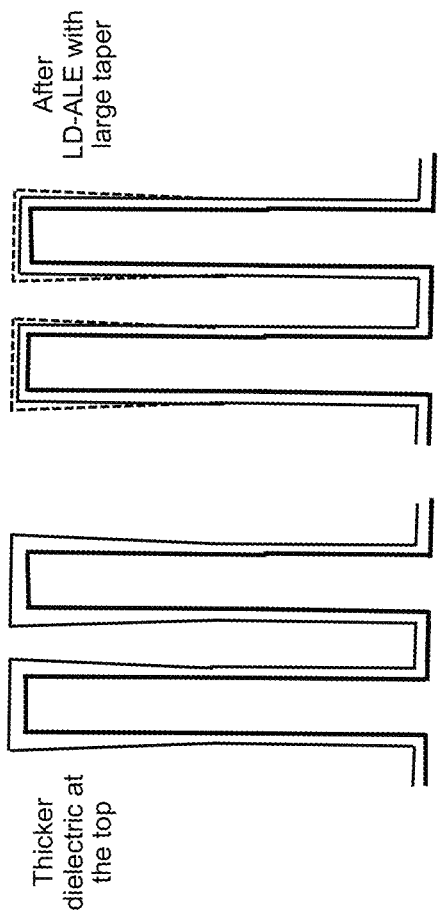
FIG. 9 is a cross-section view of a fin structure (thick line) with a deposited dielectric layer (thin line) with a thicker layer near the fin top (left) and after a LD-ALE process with a large taper producing a uniform dielectric thickness (right); the as-deposited dielectric profile is indicated by the dotted outline.

In addition to using LD-ALE to leave a film at the bottom of a HAR feature, one may consider utilizing the diffusion tail or taper of the ALE itself to reduce the thickness of a film at the top of a hole feature. For example, if a DRAM dielectric were too thick at the top of a feature, the thickness near the top could be reduced by limited dose ALE. This is illustrated in the schema of FIG. 9. The left side illustration shows a cylinder cross-section template coated with a dielectric film which is undesirably thick at the top. This may happen if an aggressive ALD process has a parasitic CVD component. Then, a LD-ALE processes having a large profile taper could be used to adjust the film thickness near the top of the feature as shown in the right side illustration of FIG. 9.

Throughput will be a challenge for this type of process because the combinations LD-ALE, ALD, etc. processes are 2 and 3 step processes, and the etch step alone has both modification and etch components.

One method of reproducibly delivering the limited dosing of precursors would be to have the precursor source held at a fixed, regulated pressure, with the limited dose set by the time the fast gas switching valve is open. An alternate method uses a precursor sub-chamber with a specific total number of precursor molecules. A fast gas switching valve opens and dumps a fraction of the sub-chamber molecules to the wafer. In practice, the valve would be closed after ~50-90% of the charge is delivered for better productivity.

ALD or ALE chamber design for the limited dose applications would preferably be a single wafer shower head design with circular symmetry which strives to deliver the same dose to the wafer at all points at approximately the same time.

It is also important to prepare the process chamber with surfaces that are similar over many depositions, because in this approach, the chamber parasitic surfaces will also be sinks for the precursors. One might use ALD or ALE to precondition the deposition lines and chamber surfaces before running a limited dose process. A reactor conditioning process may use saturating doses of appropriate ALD or ALE processes, so competing parasitic surfaces are minimal and the same, wafer to wafer.

The edges of the devices processed may not look the same as interior repeated features being processed. Layouts to accommodate edge structures may come at a penalty.

The methodology for obtaining a prescribed limited dose to obtain an objective i.e., to etch (or deposit) to a specified location would be to select a limited dose value (e.g., about ½ the onset saturation dose for a planar substrate). Once the amount of vertical film to be etched is determined, the dose may be adjusted up or down to obtain the etched film vertical value of interest.

Figure 10:
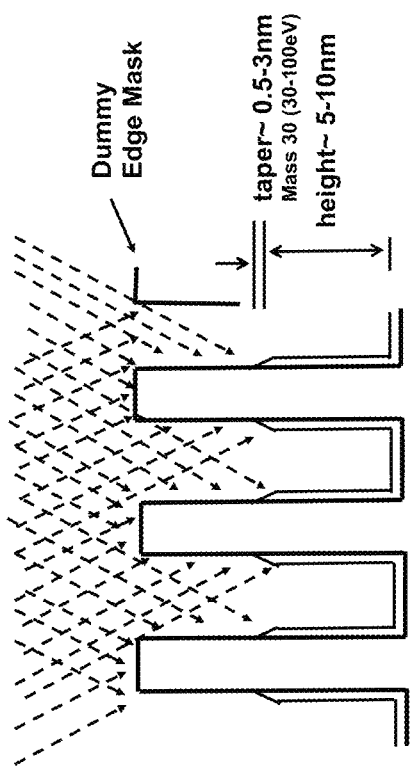
FIG. 10 illustrates angle-directed beams for local surface functionalization and modification; the beam is self-aligned by fins on both surfaces for local, sequential ion modification followed by, for example, a thermal etch step; tapers can be at the nm scale for typical masses and low energies.

For etching of localized regions on upper sidewalls of Lower Aspect Ratio features, an angle directed beams approach is proposed. This process is illustrated in FIG. 10 for a finFET, array where it is intended to etch the top of the sidewall film. Angular implants with self-aligned features have been used to make a half-pitch dimension in a lithography application, the implanted damaged regions etching faster than the non-implanted region (Zheng, P. Thesis: "Advanced MOSFET Structures and Processes for Sub-7 nm CMOS Technologies," UCB, (2016)), but were not applied to selective sidewall deposition.

The angled energetic beam, shadowed by the tops of the fins, may be an ion, radical or a neutral atom. Low energies can result in a small ion stopping range and lateral ion straggle. This provides a distinct boundary between etched and unetched regions. The use of particle energies (~50-150 eV) can result in particle stopping and lateral straggle in the 1-10 nm range (Current, M. I., Proc. 17th International Workshop on Junction Technology", IEEE, June 2017, Uji, Japan, 7-12 (2017)).

A "dummy edge fin" that lies outside and all around the fin array may be used to have a common self-aligned process, which is a lay-out area penalty.

Workpieces may be rotated to achieve functionalization of all desired surfaces. The incident angle of the implant may be changed by tilting the workpiece. Ion or neutral beams may also be angle-directed without tilting the sample if high pressure plasma sources are used having off-set slits in the source (Lee, D-H. et al., J. Korean Physical Society, 46 (4), 867-871 (2005)).

The use of angled low energy implantation to chemically functionalize or modify the surface for localized ALE etching addresses both the abruptness and position of the boundary between the etched film and the non-etched film. Variation of the implant incident angle results in variation of the position of the boundary (height) along the sidewall. A steeper angle, up to values limited by surface (bounce) scattering, can reduce the height of the non-etched film at the base of the fin. A useful range of the angle of the beam of chemically reactive species is between 5 and 85 degrees with respect to the sidewall of the non-planar feature on which the coating film is present.

The local functionalization and etch process steps are repeated until the original film near the top of the feature is removed. It is desirable to use an etch process that does not etch the underlying silicon (or other material) substrate fin. One may consider finishing the process with a lower etch rate or a fully selective process.

In this process, the "ALE" modification step can be performed with the beam, while the etch step can be either beam or thermal. Since the ion or atom ranges are nm level, the thickness of the etched layer per cycle can be a few nm, more than atomic layer-by-layer thickness, having better etch rates than layer-by-layer ALE, and might better be called Nanometer Level Etching (NLE). A 5 nm finFET array with 10 nm pitch and a 2:1 AR etched with a 45 deg angle beam would etch half the height of the sidewall film, as illustrated in FIG. 10.

If the doped film were $Al_2O_3$, an angle directed beam of F could be followed by a thermal exposure of TMA. If the doped film were $SiO_2$, a thermal exposure to TMA converts the surface to $Al_2O_3$ and would be followed by a local beam of F and another TMA thermal cycle. These are meant to be a directed beam process corresponding to thermal process chemistries already published for $Al_2O_3$ and $SiO_2$.

Figure 11:
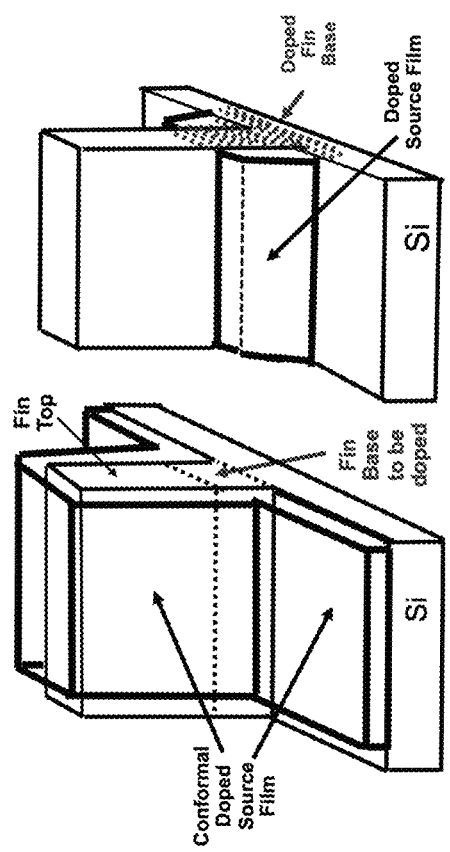
FIG. 11 is an illustration of doping of a fin base (~1× $10^{18}$/cm$^3$); ALD doped source film followed by removal of film top by angle directed beam functionalization, leaving a doped film at the bottom of the fin, followed by diffusion.

Application of angled beam etching may be applied to a finFET doping processes. A finFET process that uses doped film for the fin base doping with doping at the $1E18/cm^3$ level with opposite type doping to the source-drain. The upper part of the doped film on the fin may be etched using an angled beam process to leave a doped ALD film at the base of the fin. The doped film may be a borosilicate glass (BSG) film, or $Al_2O_3$/B doped using either halide (Mane, A. et al., J. Vac Sci. Technol., A34(1) (2016)) or non-halide (Mane, A, et.al., Paper AA2-WeA6, ALD 2019-Seattle, (2019)) chemistries for the B doping. The non-etched remaining film might (partially) provide a mask for doping processes along the sidewall of the FinFET. See FIG. 11.

Figure 12:
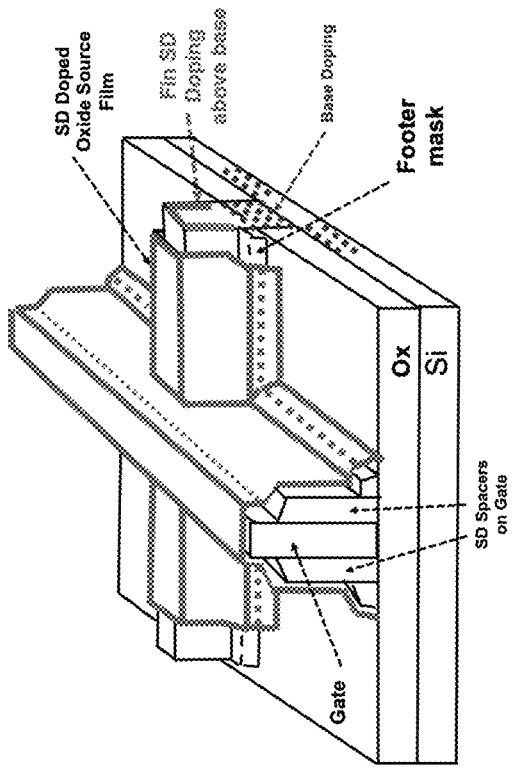
FIG. 12 is an illustration of doping of a fin source-drain doping (p or n); a conformal doped oxide is placed over a diffusion footer mask, the doped film at the top of the fin is followed by diffusion into the upper part of the fin above the fin base.

After fin formation and doping the fin base, there are many core process steps in the entire fin-FET device formation: CVD Isolation Oxidation, Chemical Mechanical Processing, Oxide etch, HiK Dielectric/Metal Gate (option) deposition on Fin, Gate Deposition and patterning, lightly doped drain (LDD) into Fin, and Gate Spacer (Hu, C-M. et al., U.S. Pat. No. 6,413,802). This set of core finFET processes are followed by the source-drain doping process. A SiN barrier film may be placed on the lower fin by ALD followed by etching of the top region with an angle directed oxygen beam followed by a TMA etch of the upper part of the SiN, leaving a diffusion barrier over the base. See FIG. 12. The Footer Mask process may be followed, for example, by source-drain doping process using out-diffusion from a conformal solid doped film.

It may be useful to combine limited dose and angle directed processes. For example, in a high or moderately high aspect ratio structure using limited dose processes may leave a first film coating on the bottom of a trench (generically a hole) and then a limited dose ALD process can place a second film at the top of the feature, and this in turn can be followed by an angle directed beam process to etch the top of the second film. The result of this combination limited dose processes and angle directed etch would leave local films at the bottom and below the top of the feature.

Thus, a film etch process is described using a self-aligned, angle-directed implant beam of a functionalizing species, with the beam being directed onto the sidewall region of a 3D feature. The implanted region enables localized atomic layer etching. One embodiment of the invention uses a first step of a self-aligned, angle-directed low energy ion implantation of chemical species for modifying a 3D feature sidewall region to provide etch functionalization, which is then followed by second step using a thermal ALEt material removal step process. Another embodiment uses a first step of self-aligned, angle-directed ion implantation of chemical species to provide etch functionalization followed by an angle directed ion sputter etch. Another embodiment uses self-aligned, angle-directed ion implantation for creating a local damaged surface which is etched selectively compared with an undamaged surface. Sequential processes using limited dose ALE, limited dose ALD and fully dosed ALD are described for obtaining localized coatings on high aspect ratio 3D features. The depth and taper are controlled by gas exposure time, as well as precursor partial pressure, flow, and purge parameters. An application is described for sidewall thickness adjustment. Angle-directed implant beams are described for localized coatings of low aspect ratio, nm scale 3D features. The depth and taper of the coatings are controlled by ion direction, energy, dose and purge processes. Applications are described for FinFET base and source-drain doping. Local film deposition on sidewalls may be challenging, but the integration of ALD and ALE processes offers a greater variety of applications than ALD and ALE alone. The overarching goal of the proposed processes is to place films at arbitrarily different places on the sidewalls of 3D structures. Limited dose gas phase precursors and localized angled implantation of chemical reactive species are considered. The issues regarding limited dose gas precursor permeation, for obtaining small penetration and small tapers, point to a preference for angle-directed implantation in nm sized low aspect ratio features.

While the invention has been described with reference to specific embodiments, the description is not considered to be limiting. Various modifications and applications may be apparent to those skilled in the art without departing from the true spirit and scope of the invention.

What is claimed is:

1. A method, comprising:
    directing a beam of chemically reactive molecular or atomic species onto a coating film disposed over a non-planar feature of a semiconductor structure, said beam incident at an angle with respect to a sidewall of the non-planar feature on which the coating film is present, said angle being between horizontal and perpendicular to the sidewall, said beam being masked, at least partially, by one or more adjacent structures on a semiconductor substrate, providing masked and non-masked portions on the non-planar feature sidewall, a non-masked portion of said beam producing a functionalized exposed area of the coating film as defining a film modification area along the coating film on the sidewall by chemical functionalization of the coating film in an area on which the non-masked portion of said beam is incident, and
    thereafter etching the functionalized exposed area of the coating film, using a compatible etch chemistry, leaving a residual coating film in a non-etched area.

2. The method of claim 1, wherein the etching is performed using a compatible angle directed beam of energetic ions, radicals, and/or neutral species.

3. The method of claim 1, wherein the non-planar feature is one of a trench, hole, fin, or finFET.

4. The method of claim 1, wherein at least one of the adjacent structures on the semiconductor substrate comprises a perimeter dummy structure.

5. The method of claim 1, wherein the beam of chemically reactive species comprises energetic ions, radicals, and/or neutral species.

6. The method of claim 5, wherein the beam of chemically reactive species has ion specie energies or equivalent energies in a range of 15-1000 eV and taper values of the coating film at a transition region between the film modification area and an unmodified portion of the film along the sidewall are in a range of 1-10 nm.

7. The method of claim 1, wherein the etching is performed by a compatible atomic layer etch process or processes.

8. The method of claim 7, wherein the coating film comprises one of: $Al_2O_3$, $HfO_2$, $ZrO_2$, SiN, Si, and W, and the beam of chemically reactive molecular or atomic species comprises one of: HF+, F+, H+, $Al(CH_3)_3$+, O+, $O_2$+, $O_3$+, $BCl_3$+, or combinations thereof, and etching the functionalized area of the coating film comprises using one of: $Al(CH_3)_3$, $Sn(acac)_2$, $SiCl_4$, or HF, whether ionized or not.

9. The method of claim 1, wherein the angle of the beam of chemically reactive species is between 5 and 85 degrees with respect to the sidewall of the non-planar feature on which the coating film is present.

10. The method of claim 9, wherein the beam of chemically reactive species comprises energetic ions, radicals, and/or neutral species.

11. The method of claim 9, wherein the etching is performed using a compatible angle directed beam of energetic ions, radicals, and/or neutral species.

12. The method of claim 9, wherein the etching is performed by a compatible atomic layer etch process or processes.

13. The method of claim 12, wherein the coating film comprises one of: $Al_2O_3$, $HfO_2$, $ZrO_2$, SiN, Si, and W, and the beam of chemically reactive molecular or atomic species comprises one of: HF+, F+, H+, $Al(CH_3)_3$+, O+, $O_2$+, $O_3$+ $BCl_3$+, or combinations thereof, and etching the functionalized area of the coating film comprises using one of: $Al(CH_3)_3$, $Sn(acac)_2$, $SiCl_4$, or HF, whether ionized or not.

* * * * *